(12) United States Patent
Moroi

(10) Patent No.: US 9,725,808 B2
(45) Date of Patent: Aug. 8, 2017

(54) RAW MATERIAL GAS SUPPLY APPARATUS

(71) Applicant: Tokyo Electron Limited, Tokyo (JP)

(72) Inventor: Masayuki Moroi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 111 days.

(21) Appl. No.: 14/824,447

(22) Filed: Aug. 12, 2015

(65) Prior Publication Data

US 2016/0047047 A1    Feb. 18, 2016

(30) Foreign Application Priority Data

Aug. 12, 2014    (JP) ................ 2014-164481

(51) Int. Cl.
| | | |
|---|---|---|
| C23C 16/455 | (2006.01) | |
| C23C 16/52 | (2006.01) | |
| C23C 16/448 | (2006.01) | |
| C23C 16/14 | (2006.01) | |

(52) U.S. Cl.
CPC .............. *C23C 16/52* (2013.01); *C23C 16/14* (2013.01); *C23C 16/4481* (2013.01); *C23C 16/455* (2013.01); *C23C 16/45525* (2013.01); *Y10T 137/2499* (2015.04); *Y10T 137/2501* (2015.04)

(58) Field of Classification Search
CPC ............... C23C 16/455; C23C 16/4481; Y10T 137/2499; Y10T 137/2501; Y10T 137/7761
USPC .......................................................... 118/715
See application file for complete search history.

(56) References Cited

U.S. PATENT DOCUMENTS

| | | | | | |
|---|---|---|---|---|---|
| 4,356,834 | A | * | 11/1982 | LeMay | ................ G05D 11/132 137/89 |
| 5,570,694 | A | * | 11/1996 | Rometsch | .......... A61B 5/02225 137/487.5 |
| 5,865,205 | A | * | 2/1999 | Wilmer | ................ G05D 7/0635 137/2 |
| 2004/0007180 | A1 | * | 1/2004 | Yamasaki | ............... C23C 16/16 118/715 |
| 2008/0141937 | A1 | * | 6/2008 | Clark | ..................... C23C 16/16 118/697 |

FOREIGN PATENT DOCUMENTS

| | | |
|---|---|---|
| JP | H05-305228 | 11/1993 |
| JP | 2006-222133 | 8/2006 |

* cited by examiner

*Primary Examiner* — Kevin Murphy

(57) ABSTRACT

A raw material gas supply apparatus is configured to obtain a difference between a set value and a measured value of a vaporized raw material, add the difference as a correction value to the set value of the flow rate of the carrier gas to maintain an amount of the vaporized raw material at the set value, and subtract a difference from a set value of a flow rate of the dilution gas to maintain a total flow rate of the carrier gas and the dilution gas at a constant level. The amount of the vaporized raw material is calculated by subtracting an integration value of a measured value of the flow rate of the inert gas in the supply period of the raw material gas from an integration value of the flow rate of the raw material gas which is measured in the supply period.

12 Claims, 8 Drawing Sheets

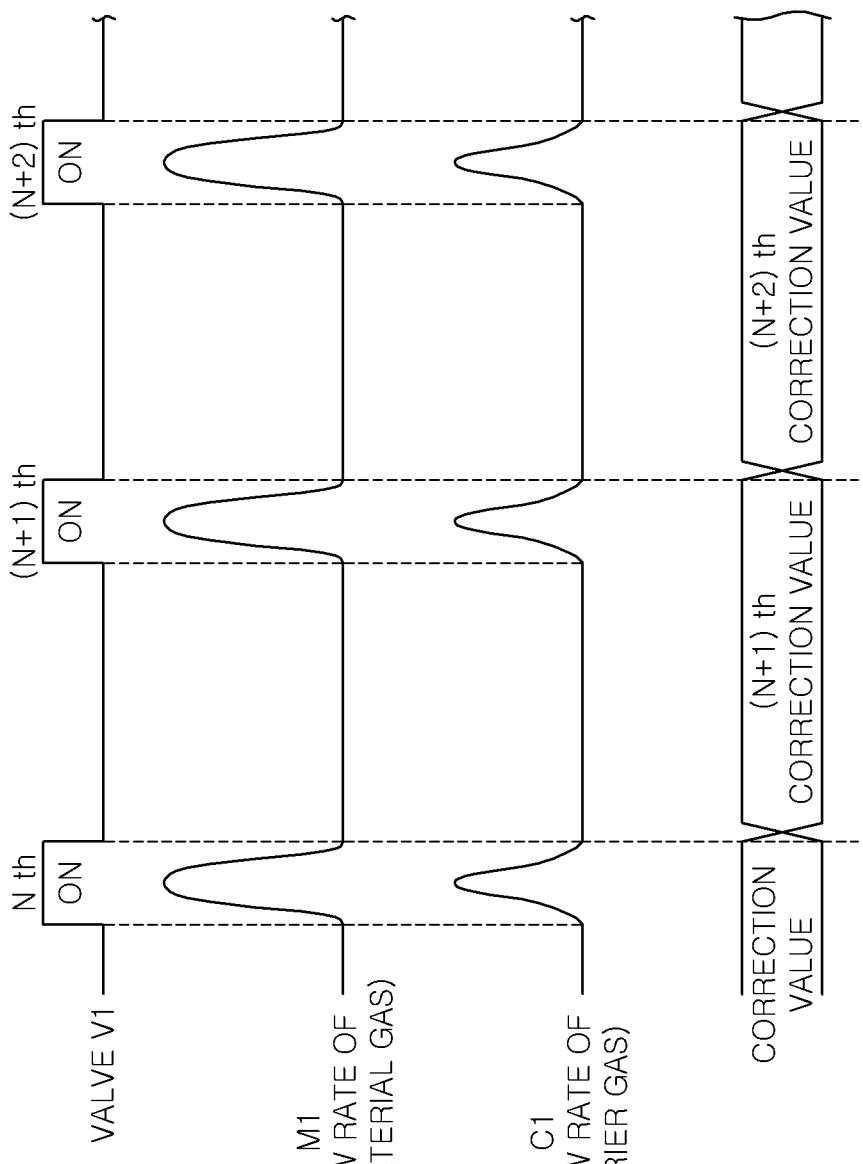

RAW MATERIAL GAS SUPPLY APPARATUS

CROSS-REFERENCE TO RELATED APPLICATIONS

This application claims priority to Japanese Patent Application No. 2014-164481 filed on Aug. 12, 2014, the entire contents of which are incorporated herein by reference.

FIELD OF THE INVENTION

The disclosure relates to a technique for controlling an amount of a vaporized raw material in a raw material gas which is obtained by vaporizing a raw material in a carrier gas supplied to a film forming unit

BACKGROUND OF THE INVENTION

An ALD (Atomic Layer Deposition) method is known as a method for forming a film on a substrate such as a semiconductor wafer (hereinafter, referred to as "wafer") or the like. The ALD method includes: adsorbing an atomic layer or a molecular layer of a raw material gas onto a surface of a wafer; supplying a reaction gas for oxidizing and reducing the raw material gas to produce reaction products; and depositing layers of the reaction products. The above operations are performed by accommodating the wafer into a processing chamber in which a vacuum atmosphere is formed and alternately and intermittently supplying the raw material gas and the reaction gas into the processing chamber by controlling opening/closing of a valve.

The raw material may be in a solid state or in a liquid state. By heating a raw material container accommodating the raw material, the raw material is vaporized to a raw material gas. A carrier gas is supplied into the raw material container. The raw material is supplied into the processing chamber by the carrier gas. The raw material gas is a mixture of the carrier gas and the vaporized raw material. An amount of the vaporized raw material (a flow rate of the raw material contained in the raw material gas) needs to be precisely controlled in order to control a thickness or a quality of a film to be deposited on the wafer.

The amount of the vaporized raw material in the raw material container varies depending on an amount of the raw material contained in the raw material container. When the raw material is in a solid state, the amount of the vaporized raw material varies depending on a change in a grain size, non-uniform distribution of the raw material in the raw material container or the like. Further, when the raw material is in a solid state, the temperature distribution in the raw material container may not be uniform. This is because convection hardly occurs in the raw material container even though a temperature in the raw material container is decreased by heat loss caused by the sublimation (considered as "vaporization" in the disclosure) of the raw material. Accordingly, the amount of the vaporized raw material may not be stable.

Japanese Patent Application Publication No. 2006-222133 (see paragraph [0036]) discloses a technique for measuring a raw material concentration in a mixed gas that is a mixture of a vaporized raw material (referred to as "raw material gas") and a carrier gas by a densitometer and maintaining a total flow rate of the raw material gas, the carrier gas, and a dilution gas having the same component as that of the carrier gas at a constant level. In addition, Japanese Patent Application Publication No. 1993-305228 (see paragraphs [0015] to [0018]) discloses a technique for measuring a total mass flow rate of a non-evaporated gas in a system and controlling the total mass flow rate to a constant level when introducing a carrier gas into a liquid raw material evaporation unit and introducing a buffer gas into the system.

However, in the ALD method, the gas containing the vaporized raw material is intermittently supplied and the supply time thereof is considerably short. Therefore, it is not possible to precisely detect the raw material concentration by the densitometer described in Japanese Patent Application Publication No. 2006-222133. The supply timing of the gas containing the raw material is controlled by opening/closing of a valve installed in a supply line. In the case of measuring the mass flow rate as described in Japanese Patent Application Publication No. 1993-305228, the flow rate is not stable because the gas supply time is short. As a result, it is difficult to control the amount of the vaporized raw material to a set value.

SUMMARY OF THE INVENTION

In view of the above, the disclosure provides a technique capable of precisely controlling an amount of a vaporized raw material in a raw material gas when supplying the raw material gas containing a vaporized gas of a solid or liquid raw material to a film forming unit.

In accordance with an aspect of the present invention, there is provided a raw material gas supply apparatus for supplying a carrier gas that is an inert gas to a raw material container accommodating a solid or liquid raw material through a carrier gas supply line and intermittently supplying a raw material gas containing a vaporized raw material to a film forming unit while alternately repeating a supply period and a pause period, the apparatus including: a mass flow controller for the carrier gas, provided in the carrier gas supply line and configured to control a flow rate of the carrier gas based on a set value of the flow rate of the carrier gas; a flow rate measurement unit, provided in a raw material gas supply line disposed at an outlet side of the raw material container and configured to measure a flow rate of the raw material gas; a dilution gas supply line connected to the raw material gas supply line so that a dilution gas that is the inert gas is mixed with the raw material gas, a mass flow controller for the dilution gas, provided in the dilution gas supply line and configured to control a flow rate of the dilution gas based on a set value of the flow rate of the dilution gas; and an operation processing unit configured to obtain a difference between a set value and a measured value of an amount of the vaporized raw material, add the difference as a correction value to the set value of the flow rate of the carrier gas to maintain the amount of the vaporized raw material at the set value, and subtract the difference from the set value of the flow rate of the dilution gas to maintain a total flow rate of the carrier gas and the dilution gas at a constant level, the amount of the vaporized raw material being calculated by subtracting an integration value of a measured value of the flow rate of the inert gas flowing through the flow rate measurement unit in the supply period of the raw material gas from an integration value of the flow rate of the raw material gas which is measured by the flow rate measurement unit in the supply period.

BRIEF DESCRIPTION OF THE DRAWINGS

The objects and features of the disclosure will become apparent from the following description of embodiments, given in conjunction with the accompanying drawings, in which:

FIGS. 3A to 3D are time charts showing temporal changes in opening/closing of a valve, a flow rate of a raw material gas, a flow rate of a carrier gas, and a correction value;

DETAILED DESCRIPTION OF THE EMBODIMENTS

Figure 1:
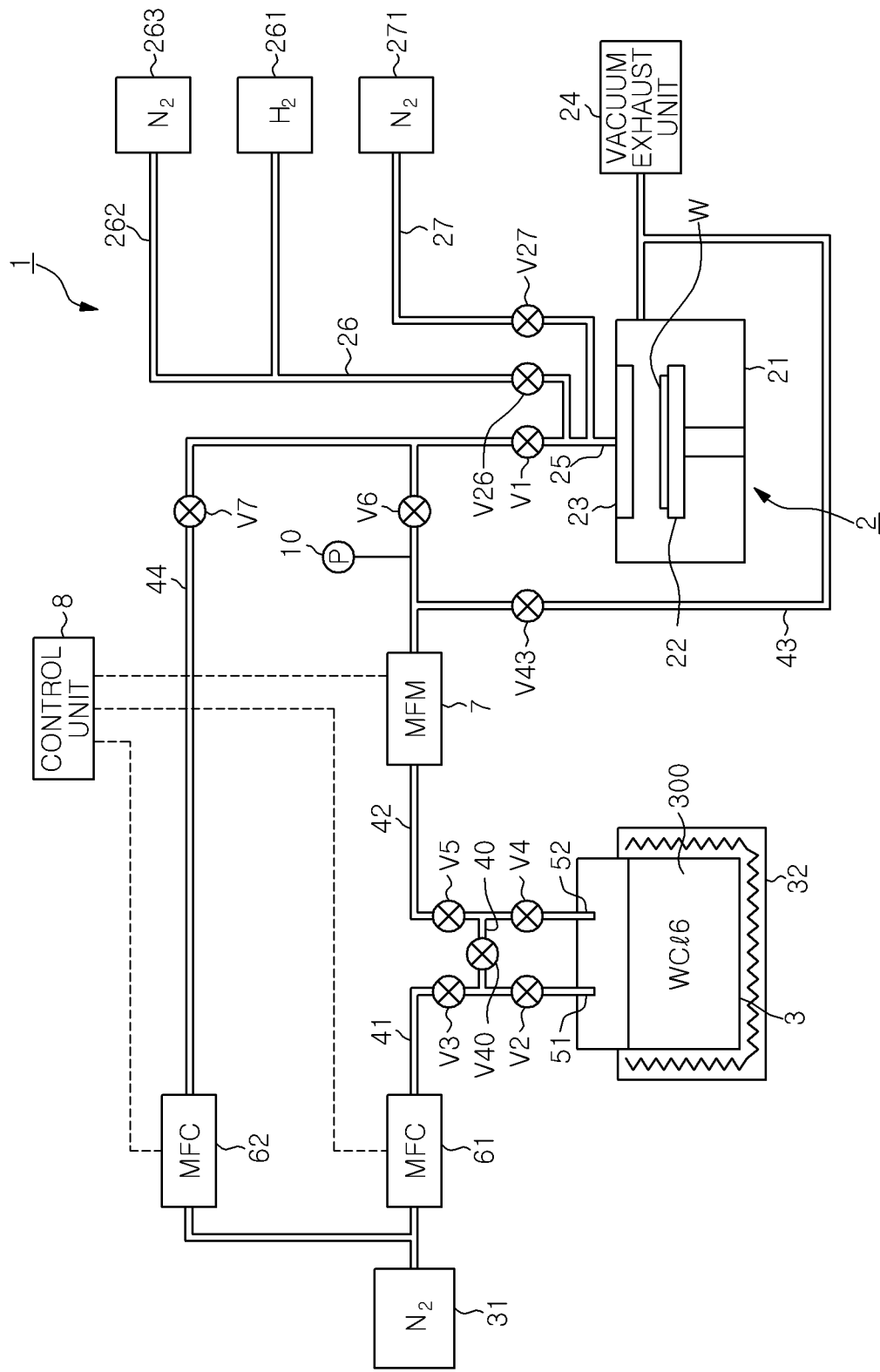
FIG. 1 shows an overall configuration of a first embodiment of a film forming apparatus to which a raw material gas supply apparatus of the disclosure is applied.

Hereinafter, a configuration example in which a raw material gas supply apparatus of the disclosure is applied to a film forming apparatus will be described with reference to FIG. 1. A film forming apparatus 1 according to an embodiment includes a film forming unit 2 for forming a film on a wafer W as a substrate by an ALD method, and a raw material gas supply unit for supplying a raw material gas to the film forming unit 2.

The film forming unit 2 includes a mounting table 22 having a heater (not shown) and a gas inlet 23 for introducing a raw material gas and the like into the chamber 21. The mounting table 22 is configured to horizontally hold the wafer W in a chamber (processing chamber) 21, e.g., a vacuum container. The chamber 21 is evacuated by a vacuum exhaust unit 24 including a vacuum pump or the like. By introducing the raw material gas into the chamber 2 from the raw material gas supply unit, a film is formed on the surface of the heated wafer W.

For example, when a tungsten (W) film is formed, $WCl_6$ that is in a solid state at a room temperature is used as a raw material and hydrogen ($H_2$) gas is used as a reaction gas (reduction gas) that reacts with the raw material. To that end, a gas supply line 25 is connected to the gas inlet 23 and joins with a raw material gas supply line 42 for supplying a raw material gas containing $WCL_6$ to be described later, a reaction gas supply line 26 for supplying a reaction gas that reacts with the raw material gas, and a substitute gas supply line 27 for supplying a substitute gas via valves V1, V26 and V27, respectively. The reaction gas supply line 26 is connected to a reaction gas supply source 261 and also connected to an inert gas (e.g., nitrogen ($N_2$) gas) supply source 263 via a gas supply line 262. The substitute gas supply line 27 is connected to a substitute gas (e.g., $N_2$ gas) supply source 271.

In this example, the raw material gas supply unit includes a raw material container 3 accommodating $WCl_6$ as a raw material, and a carrier gas supply source 31 for supplying a carrier gas into the raw material container 3. The raw material container 3 accommodates $WCl_6$ that is in a solid state at a room temperature. The raw material container 3 is covered by a jacket-shaped heating unit 32 having a resistance heating element. The raw material container 3 is configured such that a temperature in the raw material container 3 can be controlled by increasing/decreasing the amount of power supplied from a power supply unit (not shown) based on a temperature of a gas phase part in the raw material container 3 which is detected by a temperature detection unit (not shown). A temperature of the heating unit 32 is set to a level at which a solid raw material 300 is sublimated and $WCl_6$ is not decomposed, e.g., about 150° C.

Inserted into the gas phase part above the solid raw material in the raw material container 3 are a carrier gas nozzle 51 corresponding to a downstream end portion of the carrier gas supply line 41 and a raw material gas extracting nozzle 52 corresponding to an upstream end portion of the raw material gas supply line 42. A mass flow controller (MFC) 61 for a carrier gas, a valve V3, and a valve V2 are installed in the carrier gas supply line 41 in that order from the upstream side. In this example, an $N_2$ gas supply source is provided as the carrier gas supply source 31 at the upstream side.

Figure 2:
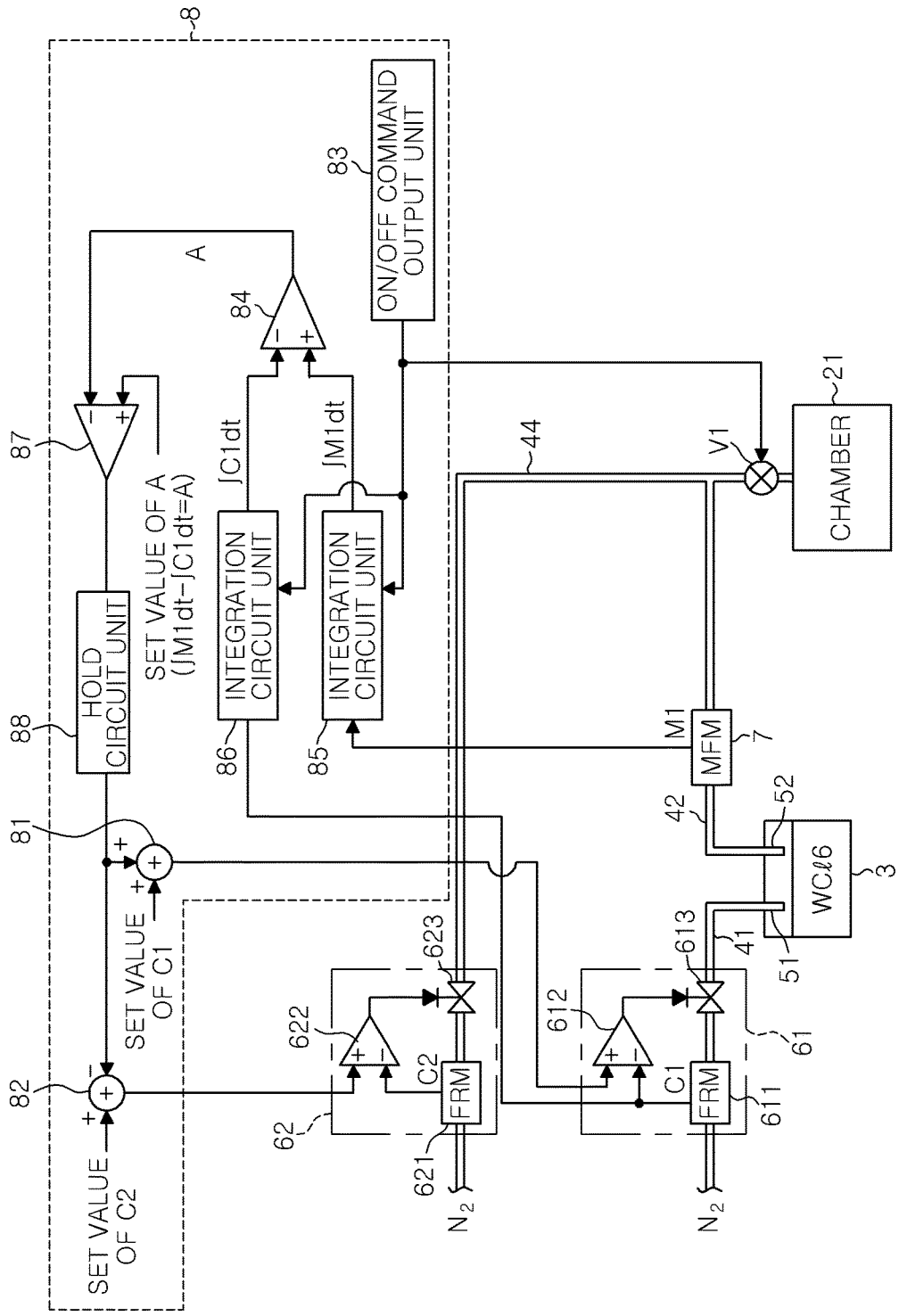
FIG. 2 shows a configuration of a control unit of the film forming apparatus.

As shown in FIG. 2, for example, the mass flow controller 61 includes a flow rate measurement unit (FRM) 611, a PID operation unit 612, and a flow rate control valve 613. The flow rate control valve 613 is controlled based on a signal corresponding to a difference between the set value and the measured value such that the flow rate becomes the set value.

A valve V4, a valve V5, a mass flow meter (MFM) 7 that is a flow rate measurement unit, a pressure gauge 10, and a valve V6 are installed in the raw material gas supply line 42 in that order from the upstream side. A branch line 43 having a valve V43 is branched at a point between the mass flow meter 7 and the valve V6. A downstream end of the branch line 43 is connected to the aforementioned vacuum exhaust unit 24. A point between the valves V2 and V3 of the carrier gas supply line 41 and a point between the valves V4 and V5 of the raw material gas supply line 42 are connected by a bypass line 40 having a valve V40.

As will be described later, when the carrier gas is supplied into the raw material container 3 from the carrier gas supply line 41, the solid raw material is vaporized (sublimated) and supplied to the film forming unit 2 through the raw material gas supply line 42. The mass flow meter 7 is used for measuring a flow rate of the raw material gas that is a mixed gas of the vaporized raw material and the carrier gas.

A dilution gas supply line 44 for supplying a dilution gas to be mixed with the raw material gas joins with the raw material gas supply line 42 at the downstream side of the valve V6. A valve V7 and a mass flow controller (MFC) 62 for a dilution gas are installed in the dilution gas supply line 44. A dilution gas supply source for supplying $N_2$ gas as a dilution gas is installed at the upstream side. Since the dilution gas is the same as the carrier gas, the dilution gas and the carrier gas are supplied from a common supply source 31 in this example. As shown in FIG. 2, the mass flow controller 62 includes a flow rate measurement unit (FRM) 621, a PID operation unit 622, and a flow rate control valve 623. Although $N_2$ gas that is an inert gas is used as the carrier gas and the dilution gas, a gas that does not react with the raw material and does not affect a film forming process is included in "the inert gas" in the disclosure.

As will be described later, when a W film is formed by the film forming unit 2, the raw material gas containing $WCl_6$ and $H_2$ gas as a reaction gas are alternately supplied. Further, a substitute gas for substituting an atmosphere in the chamber 21 is supplied between the supply of the raw material gas and the supply of the reaction gas. The raw material gas is intermittently supplied to the film forming unit 2 while alternately repeating a supply period and a pause period. The supply of the raw material gas is controlled by controlling ON/OFF of the valve V1. The valve V1 is configured to be opened/closed by an ON/OFF command output unit 83 of a control unit 8 to be described later. "ON" indicates an open state of the valve V1. "OFF" indicates a closed state of the valve V1. In the same manner, the supply of the reaction gas is controlled by controlling ON/OFF of the valve V26. The supply of the substitute gas is controlled by controlling ON/OFF of the valve V27.

Next, the control unit of the film forming unit 1 will be described with reference to FIG. 2. The control unit 8 is, e.g., a computer including a CPU and a storage unit (both not shown). The storage unit stores a program having a control step (command) group related to the operation of the film forming unit 1. The operation of the film forming apparatus includes: mounting the wafer W on the mounting table 22; evacuating the chamber 21; supplying the raw material gas and the reaction gas alternately; forming a film by using an ALD method; and unloading the wafer W. The program is stored in a storage medium, e.g., a hard disk, a compact disk, a magnet optical disk, a memory card or the like, and installed in the computer.

The control unit 8 surrounded by a dotted line in FIG. 2 actually includes, e.g., a controller and a host computer for sending a signal to the controller. However, in FIG. 2, the host computer is not illustrated and a circuit block of the controller is mainly illustrated.

The control unit 8 includes: a circuit unit for obtaining a set value of a flow rate of the mass flow controller 61 installed in the carrier gas supply line 41 and sending the set value to a positive input terminal of the PID operation unit 612 of the mass flow controller 61; and a circuit unit for obtaining a set value of a flow rate of the mass flow controller 62 installed in the dilution gas supply line 44 and sending the set value to a positive input terminal of the PID operation unit 622 of the mass flow controller 62. For convenience, in the following description, a flow rate of the carrier gas flowing through the carrier gas supply line 41 is denoted as C1 and a flow rate of the dilution gas flowing through the dilution gas supply line 44 is denoted as C2. The circuit units respectively include an adder 81 for adding a correction value to the set value of the flow rate C1 of the carrier gas and an adder 82 for subtracting the correction value from the set value of the flow rate C2 of the dilution gas (adding the correction value as a negative value). As for the set value of the flow rate C1 and the set value of the flow rate C2, values stored in the process recipe are read out and sent to the adders 81 and 82 from the host computer, for example.

Next, the circuit unit for calculating (correcting) the set value of the flow rate C1 of the carrier gas and the set value of the flow rate C2 of the dilution gas will be described. The film forming apparatus 1 according to the embodiment for performing an ALD method supplies the raw material gas into the chamber 21 by intermittently switching ON the valve V1. To do so, the host computer outputs an ON signal of the valve V1 which indicates a raw material gas supply start timing and an OFF signal of the valve V1 which indicates a raw material gas supply stop timing based on the process recipe. In FIG. 2, for convenience, a part for outputting the ON signal and the OFF signal is illustrated as the ON/OFF command output unit 83.

As described above, in the ALD method, a cycle of supplying the raw material gas, the substitute gas, the reaction gas and the substitute gas in that order is repeated multiple times. The timing of the ON signal and the OFF signal is determined by the recipe that specifies such a cycle. For example, a period of time between the ON signal and the OFF signal, i.e., the supply period of the raw material gas, is 1 sec, and the supply pause period of the raw material gas is 10 sec. A primary PID operation unit 84 calculates a vaporization amount A of the raw material by subtracting the flow rate C1 of the carrier gas from a flow rate M1 of the raw material gas (the mixed gas of the carrier gas and the vaporized raw material) in the supply period of the raw material gas.

The vaporization amount A of the raw material is determined by subtracting the measured flow rate of the mass flow controller 61 (specifically, the flow rate measurement unit 611) from the measured flow rate of the mass flow meter 7. Since, however, the raw material gas supply time is short, the measured flow rate is decreased before it is increased to be stable so that the measured flow rate may become unstable. Therefore, the measured flow rates outputted from the mass flow meter 7 and the mass flow controller 61 are respectively integrated by integration circuit units 85 and 86 in the supply period and the PID operation unit 84 performs operation while using the integration values thus obtained as the flow rates in the supply period. The integration circuit units 85 and 86 are configured to start the integration by the ON signal from the ON/OFF command output unit 83 and terminate the integration by the OFF signal. Specifically, for example, the integration circuit units 85 and 86 include time constant circuits and are formed by combining switches and the like such that they are charged in response to the ON signal and discharged in response to the OFF signal.

A secondary PID operation unit 87 is provided at a downstream side of the primary PID operation unit 84. The PID operation unit 87 calculates a deviation of the vaporization amount A of the raw material gas which is obtained by the PID operation unit 84 from the set value. The output of the primary PID operation unit 84 (the measured value of the vaporization amount A of the raw material) and the set value of the vaporization amount A of the raw material are inputted into a negative input terminal and a positive input terminal of the secondary PID operation unit 87, respectively, and the deviation amount corresponding to the difference therebetween is outputted.

A hold circuit unit (hold circuit) 88 for holding a signal for a certain period of time is provided at a downstream side of the secondary PID operation unit 87. The hold circuit unit 88 is configured such that an inputted voltage is held until the supply period of the raw material gas supply is completed, i.e., until the OFF signal of the valve V1 is outputted, and the held voltage value is reset to zero by the input of the OFF signal. An example of the hold circuit unit 88 may be configured such that an analog signal from the PID operation unit 87 is converted to a digital signal by using an analog/digital conversion unit, a register, and a digital/analog conversion unit and held by the register and the register is reset by the OFF signal. In that case, as will be described later, a difference from the set value of the raw material gas in an n-th supply period is outputted, as a correction value for the set value of C1 and C2 in an (n+1)th supply period, from the hold circuit unit 88 to the adders 81 and 82. In the present embodiment, the operation processing unit is formed by the adders 81 and 82, the integration circuit units 85 and 86, the primary PID operation unit 84, and the secondary PID operation unit 87.

Next, the operation of the above embodiment will be described. First, the raw material gas supply unit and the film forming unit 2 will be briefly described. In the raw material container 3, the power is supplied to the heating unit 32 and $WCl_6$ that is in a solid state at a room temperature is sublimated by heating to, e.g., about 150° C. Since the flow rate M1 of the raw material gas is measured by the mass flow meter 7, a vapor pressure needs to be increased to a certain level. Therefore, as for the raw material, there is used one having a vapor pressure of about 66.5 Pa (0.5 Torr) or greater at a vaporization temperature. $WCl_6$ has a vapor pressure of about 93.1 Pa (0.7 Torr) or greater at 150° C.

In the film forming unit 2, the wafer W is mounted on the mounting table 22 and the chamber 21 is evacuated. Then, the wafer W is heated to prepare the film formation. Next, the carrier gas is supplied into the raw material container 3 to generate the raw material gas by opening the valves V1 to V6 of the raw material container 3. The dilution gas is mixed with the raw material gas by opening the valve V7 of the dilution gas supply line 44.

In the film forming unit 2, the raw material gas containing $WCl_6$ (the mixed gas of the gaseous raw material and the carrier gas) and the dilution gas are supplied through the gas inlet 23 via the gas supply line 25. In the case of forming a tungsten (W) film by an ALD method, $WCL_6$ is adsorbed onto the surface of the wafer W by supplying the raw material gas and the dilution gas into the chamber 21 for, e.g., about 1 sec, by opening the valve V1 and then closing the valve V1. Subsequently, the substitute gas ($N_2$ gas) is supplied into the chamber 21 to substitute an atmosphere in the chamber 21. Thereafter, the reaction gas ($H_2$ gas) is supplied into the chamber 21 to reduce $WCl_6$ adsorbed onto the wafer W with $H_2$ by opening the valve V26 and then closing the valve V26. As a consequence, a W film of a single atomic layer is formed. Next, the substitute gas is supplied into the chamber 21 to substitute an atmosphere in the chamber 21. A W film with a predetermined thickness is formed by repeating the cycle of supplying the raw material gas containing $WCl_6$, the substitute gas, the reaction gas, and the substitute gas into the chamber 21 in that order by controlling ON/OFF of the valves V1, V26 and V27.

Next, the flow rate control of the raw material gas, the carrier gas and the dilution gas in the present embodiment will be described. In the following description, the flow rate of the carrier gas is denoted as C1; the flow rate of the dilution gas is denoted as C2; and the flow rate of the raw material gas flowing through the raw material gas supply line 42 is denoted as M1, as described above.

As described above, the flow rate of the carrier gas is controlled by the mass flow controller 61 such that the set value of the flow rate C1 of the carrier gas which is instructed by the host computer becomes a corrected set value to be described later. The flow rate of the dilution carrier gas is controlled by the mass flow controller 62 such that the set value of the flow rate C2 of the dilution gas becomes a corrected set value to be described later.

FIG. 3A shows the state of the valve V1 for controlling starting and terminating of the supply of the raw material gas. An ON period indicates a supply period of the raw material gas and an OFF period indicates a supply pause period of the raw material gas. In an n-th supply period (n being an integer greater than or equal to 2), the integration circuit units 85 and 86 start the integration of the flow rate M1 of the raw material gas and the flow rate C1 of the carrier gas based on the ON command of the valve V1 and terminate the integration based on the OFF command of the valve V1. FIGS. 3B and 3C show changes in the measured values of the flow rate M1 of the raw material gas and the flow rate C1 of the carrier gas, respectively. Since the supply period of the raw material gas is short, the flow rate M1 of the raw material gas and the flow rate C1 of the carrier gas are rapidly increased and immediately decreased after the ON command of the valve V1 is executed. A ratio between the supply period and the pause period shown in FIGS. 3A to 3D is only an example for convenience of illustration.

After the OFF command of the valve V1 is executed, a difference A calculated by subtracting an integration value ($\int C1 dt$) of the flow rate C1 of the carrier gas from an integration value ($\int M1 dt$) of the flow rate M1 of the raw material gas in the PID operation unit 84 is obtained as a result of the PID operation. The difference A corresponds to the vaporization amount (flow rate) of the raw material in the raw material gas. A value corresponding to the difference between the vaporization amount A and a preset value of the vaporization amount A is obtained as a result of the PID operation in the PID operation unit 87. Further, during the OFF command of the valve V1, the hold circuit unit 88 resets the value that has been held and newly holds a value that is outputted from the PID operation unit 87 at that timing. Such an operation of the hold circuit unit 88 is performed after the integration values of the flow rate C1 of the carrier gas and the flow rate M1 of the raw material gas in the corresponding supply period are determined. For example, the reset process of the hold circuit unit 88 is performed at a timing after the execution of the OFF command of the valve V1. FIG. 3D shows correlation between a state in which the correction value is held by the hold circuit unit 88 and the ON period (supply period) of the valve V1.

The difference between the vaporization amount A of the raw material thus obtained and the set value of the vaporization amount A becomes a correction value for the set values of the flow rate C1 of the carrier gas and the flow rate C2 of the dilution gas in a next supply period. A value corresponding to the difference (e.g., a value obtained by multiplying the difference by a coefficient) is added to the flow rate C1 of the carrier gas and subtracted from the flow rate C2 of the dilution gas. In the first supply period, the correction value is set to zero, for example.

Figure 4A:
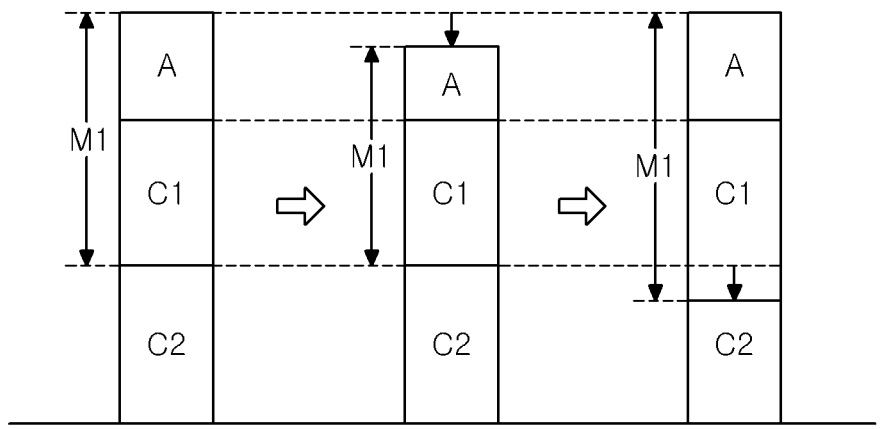
FIGS. 4A and 4B are schematic diagrams for explaining flow rate control of the raw material gas, the carrier gas and a dilution gas.
Figure 4B:
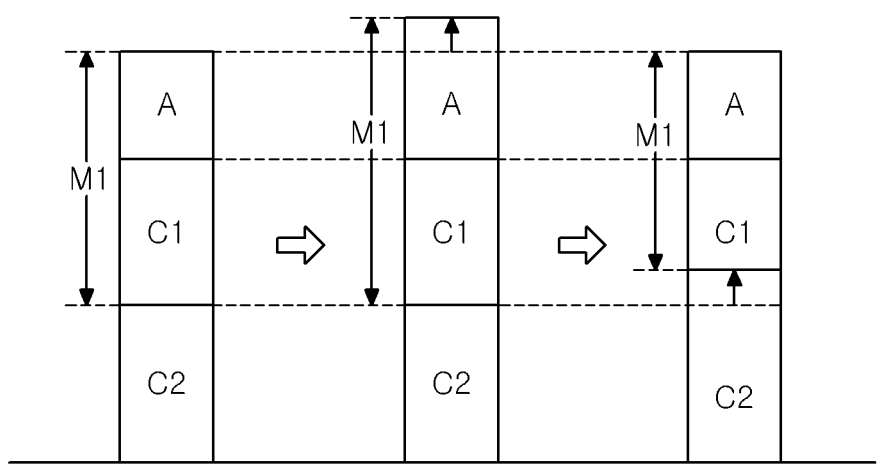

FIGS. 4A and 4B schematically show the flow rate control of the raw material, the carrier gas and the dilution gas. If the vaporization amount A of the raw material in the raw material gas is the set value in a certain supply period, the correction value held by the hold circuit unit 88 is zero. Such a state is illustrated at the left side of FIG. 4A. As illustrated at the center of FIG. 4A, the vaporization amount A of the raw material becomes smaller than the set value due to the decrease in the solid raw material in the raw material container 3, for example. This may be caused by a decrease in a flow velocity of the carrier gas that collides with the solid raw material due to an increase in a distance from an outlet port of the carrier gas nozzle 51 to the surface of the solid raw material, a reduction in a surface area due to a reduction in a grain size of the solid raw material, or the like. In other words, if the vaporization amount A obtained in an n-th supply period is smaller than the set value, for example, the difference is outputted from the hold circuit unit 88 in an (n+1)th supply period. Therefore, the set value of the flow rate C1 of the carrier gas is increased by the amount of decrease in the vaporization amount A and, further, the flow rate C1 is increased. For example, there is obtained a relation between the amount of decrease in the vaporization amount A of the raw material and the amount of increase in the flow rate C1 which is required to increase the vaporization amount A by the amount of decrease in the vaporization amount A. Then, the amount of decrease in the vaporization amount A is multiplied by a coefficient obtained from the relation and the result thereof becomes a correction value for the set value of the flow rate C1 of the carrier gas.

Due to the increase in the flow rate C1 of the carrier gas, the total flow rate of the flow rate C1 of the carrier gas, the vaporization amount A of the raw material, and the flow rate C2 of the dilution gas becomes greater than the total flow rate measured when the vaporization amount A is the set value. Therefore, the set value of the flow rate C2 of the dilution gas is decreased by the amount of the correction value. As a result, the flow rate C2 of the dilution gas is decreased by the amount of increase in the flow rate C1 of the carrier gas. By performing such control, the total flow rate of the flow rate C1 of the carrier gas, the vaporization amount A of the raw material and the flow rate C2 of the dilution gas is hardly changed. Such a state is illustrated at the right side of FIG. 4A. Since the vaporization amount A of the raw material is smaller compared with the flow rate C1 of the carrier gas, the total flow rate is hardly changed even when correcting the set value of the flow rate C2 of the dilution gas by the amount of variation in the flow rate C1 of the carrier gas.

As shown at the center of FIG. 4B, if the vaporization amount A of the raw material is greater than the set value due to the temperature distribution in the raw material container 3 or the like, i.e., if the vaporization amount A obtained in the n-th supply period is greater than the set value, the set value of the flow rate C1 of the carrier gas is decreased by the amount of increase in the vaporization amount A and, further, the flow rate C1 is decreased. Due to the decrease in the flow rate C1 of the carrier gas, the total flow rate of the flow rate C1, the vaporization amount A of the raw material and the flow rate C2 of the dilution gas becomes smaller than the total flow rate measured when the vaporization amount A is the set value. Therefore, the set value of the flow rate C2 of the dilution gas is controlled to be increased by the amount of the correction value. Accordingly, the flow rate C2 of the dilution gas is increased by the amount of decrease in the flow rate C1 of the carrier gas. In that case as well, the total flow rate is hardly changed. FIGS. 4A and 4B are images schematically showing the variation in the vaporization amount A of the raw material and the variation in the flow rate C1 of the carrier gas and the flow rate C2 of the dilution gas.

In the above-described embodiment, when the mixed gas of the dilution gas and the raw material gas containing the carrier gas and the gaseous raw material is supplied to the film forming unit 2, the flow rate of the carrier gas is controlled based on the vaporization amount of the raw material which is obtained by subtracting the flow rate of the carrier gas from the flow rate of the raw material gas. The vaporization amount A of the raw material is obtained by subtracting an integration value of the measured flow rate of the carrier gas flowing through the mass flow meter 7 (the flow rate C1 measured by the mass flow controller 61) in the supply period of the raw material gas from an integration value of the flow rate M1 of the raw material gas which is measured by the mass flow meter 7 in the supply period. Therefore, in the case of intermittently supplying the raw material gas to the film forming unit 2 while alternately repeating the supply period and the pause period, the vaporization amount of the raw material can be obtained with high precision even when the flow rate of the raw material gas is not stable in the raw material gas supply period.

The flow rate C1 of the carrier gas is corrected based on the variation in the vaporization amount A of the raw material thus obtained and, also, the flow rate C2 of the dilution gas is controlled to compensate the variation in the flow rate C1 of the carrier gas. Therefore, the vaporization amount A of the raw material can be controlled with high precision and the raw material gas having a stable vaporization amount A can be supplied to the film forming unit 2. Further, it is possible to suppress the variation in the total flow rate of the vaporization amount A of the raw material, the flow rate C1 of the carrier gas and the flow rate C2 of the dilution gas. Accordingly, the film forming process of the film forming unit 2 becomes stable and it is easy to control a thickness or a quality of the film formed on the wafer.

As described in the background of the invention, when the raw material is in a solid state, the vaporization state varies due to changes in a grain size or non-uniform distribution of the raw material in the raw material container 3 and, also, the temperature distribution in the raw material container 3 may not be uniform. Therefore, the concentration (the flow rate) of the raw material in the raw material gas may not be stable. Accordingly, the vaporization amount of the raw material can be effectively stabilized by the technique of the disclosure.

Figure 5:
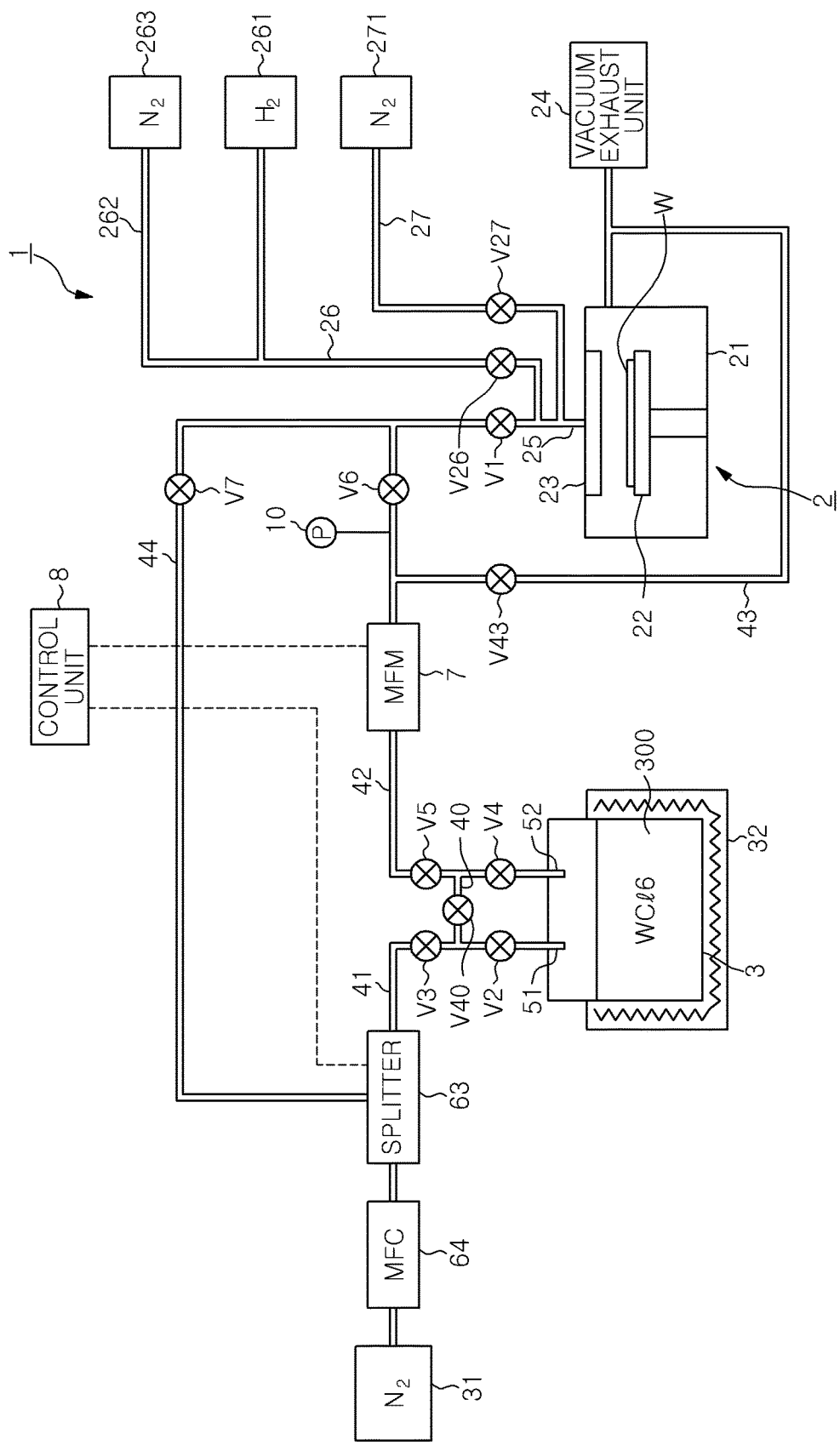
FIG. 5 shows an overall configuration of a modification of the first embodiment of the film forming apparatus to which the raw material gas supply apparatus of the disclosure is applied.
Figure 6:
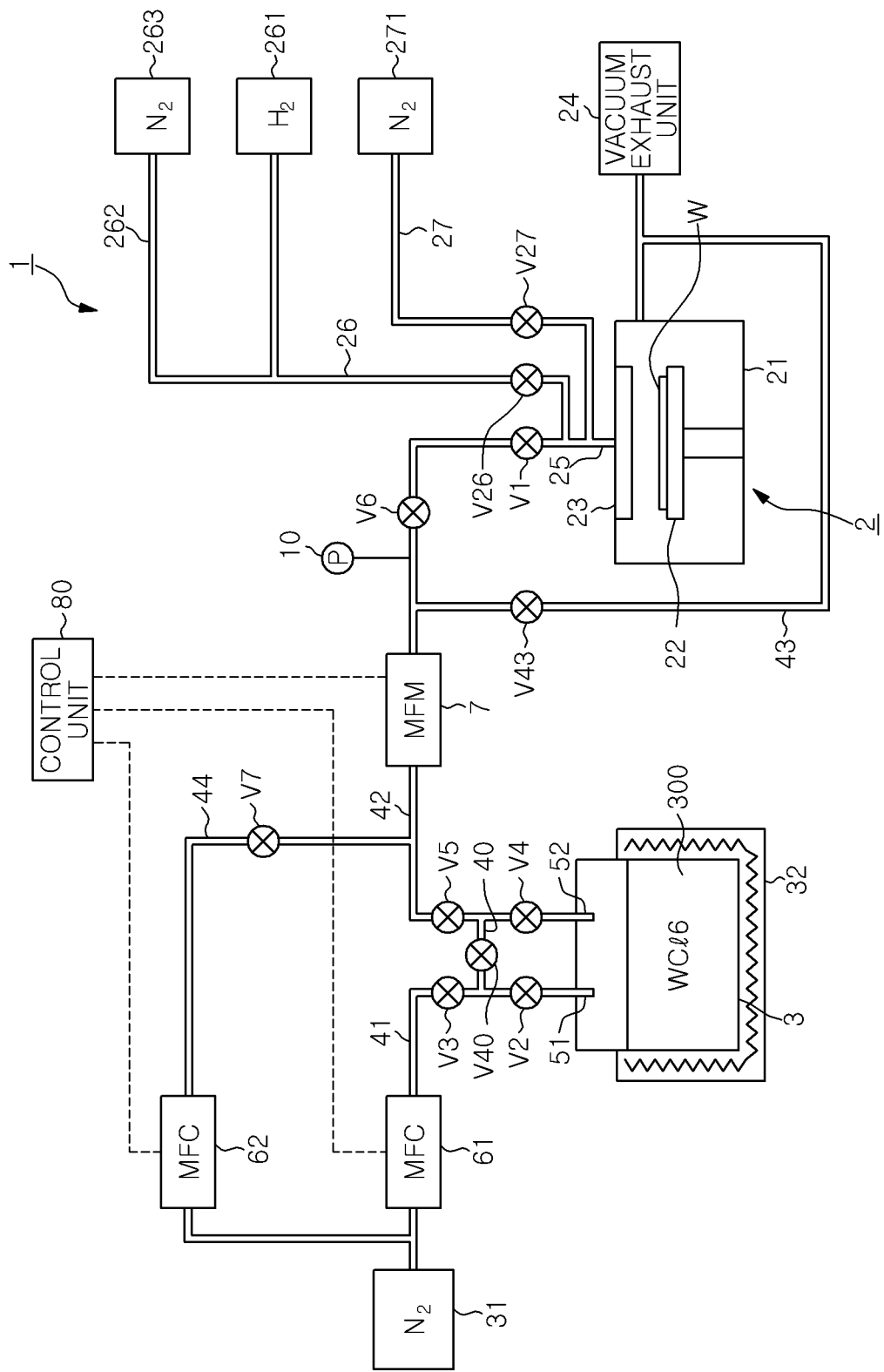
FIG. 6 shows an overall configuration of a second embodiment of the film forming apparatus to which the raw material gas supply apparatus of the disclosure is applied.

In the present embodiment, there may be used a splitter 63 having two mass flow controllers formed as one unit as shown in FIG. 5 instead of providing two mass flow controllers MFC 61 and 62 in the carrier gas supply line 41 and the dilution gas supply line 44, respectively, as shown in FIG. 1. In this example, the splitter 63 is provided at a junction part between the carrier gas supply line 41 and the dilution gas supply line 44 to distribute the flow rate of $N_2$ gas into the flow rate C1 flowing through the carrier gas supply line 41 and the flow rate C2 flowing through the dilution gas supply line 44. In this case, the arrangement of the lines is equivalent to that of the first embodiment, so that the same effect is obtained. The mass flow controller 64 shown in FIG. 5 does not control the flow rate C1 of the carrier gas or the flow rate C2 of the dilution gas.

Figure 7:
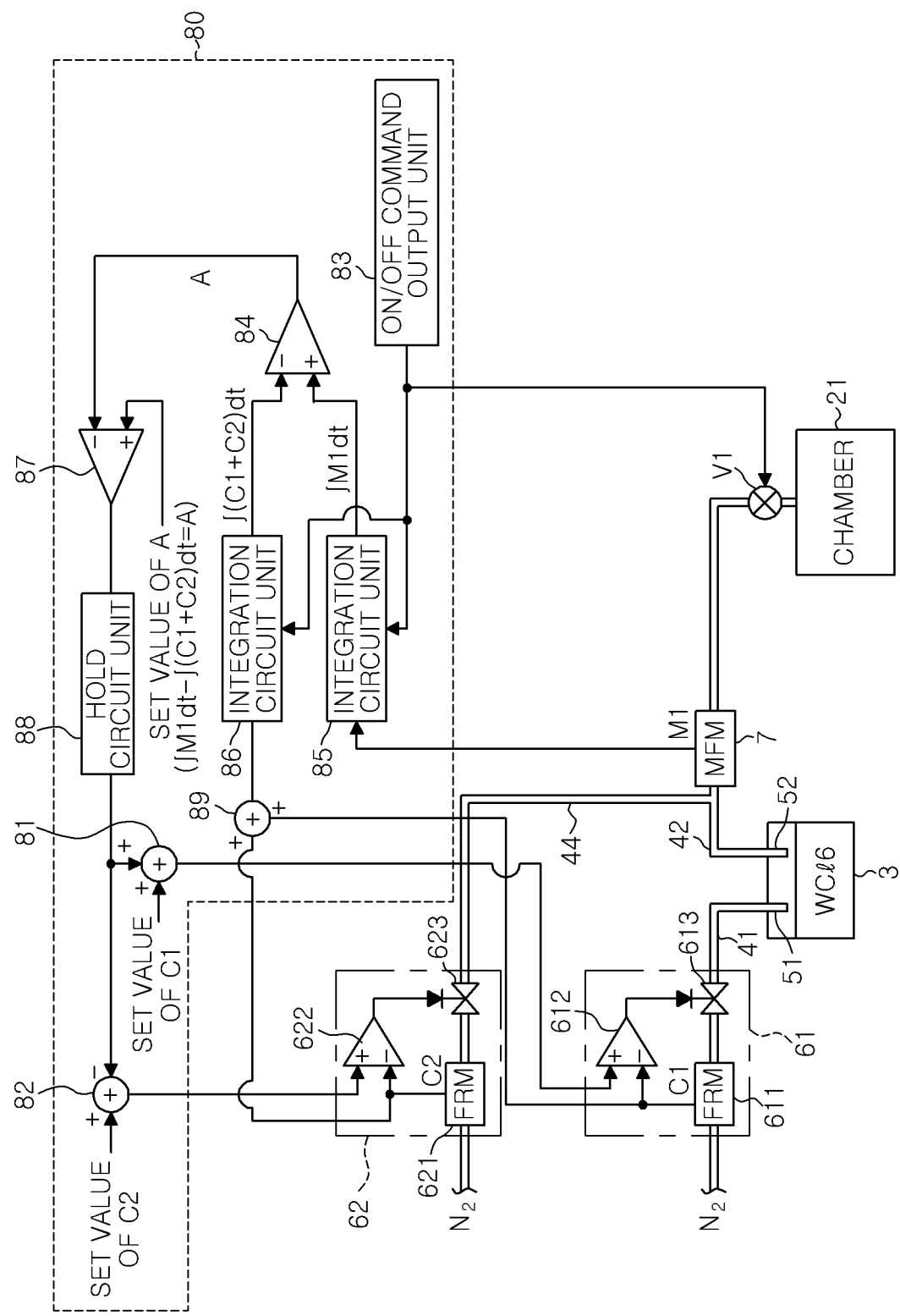
FIG. 7 is a configuration diagram showing a control unit of the film forming apparatus.

Next, the film forming apparatus according to a second embodiment will be described with reference to FIGS. 6 to 8B. The film forming apparatus according to the second embodiment is different from the film forming apparatus shown in FIG. 1 in that the downstream side of the dilution gas supply line 44 is connected to the upstream side of the mass flow meter 7 in the raw material gas supply line 41. For example, the downstream side of the dilution gas supply line 44 is connected between the valve V5 and the mass flow meter 7 in the raw material gas supply line 42. FIG. 7 shows a control unit 80 of this example. The control unit 80 is different from the control unit 8 shown in FIG. 2 in that an adder 89 is provided at an upstream side of the integration circuit unit 86 to add the flow rate C1 of the carrier gas which is measured by the mass flow controller 61 and the flow rate C2 of the dilution gas which is measured by the mass flow controller 62.

Thus, the integration circuit unit 86 calculates an integration value ($\int(C1+C2)dt$) of the total flow rate of the measured flow rate of the carrier gas and the measured flow rate of the dilution gas. Accordingly, in this example, the PID operation unit 84 calculates the vaporization amount A of the raw material in the raw material gas by subtracting the integration value ($\int(C1+C2)dt$) of the total flow rate of the measured flow rate of the carrier gas and the measured flow rate of the dilution gas from an integration value ($\int M1 dt$) of the flow rate of the raw material gas which is measured by the mass flow meter 7. The other configuration is the same as that of the film forming apparatus shown in FIG. 1. Therefore, like reference numerals will be used for like parts and redundant description will be omitted.

Figure 8A:
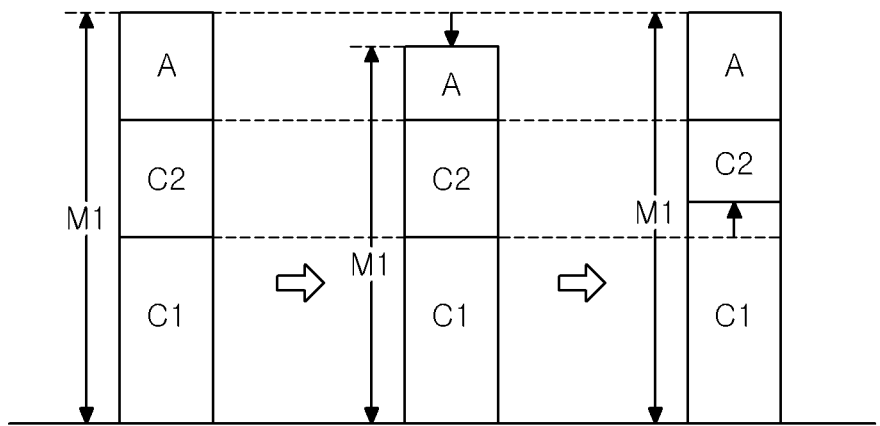
FIGS. 8A and 8B are schematic diagrams for explaining flow rate control of a raw material gas, a carrier gas and a dilution gas.

In this example, the on/off of the valve in the case of forming a film by an ALD method is the same as that in the film forming apparatus shown in FIG. 1. The flow rate control of the raw material, the carrier gas and the dilution gas will be described with reference to the schematic diagram of FIGS. 8A and 8B. The left side of FIG. 8A shows a state in which the vaporization amount A of the raw material in the raw material gas in a certain supply period is the set value and the correction value held by the hold circuit unit 88 is zero. As illustrated at the center of FIG. 8A, if the vaporization amount A obtained in the n-th supply period, for example, is smaller than the set value, the difference is outputted from the hold circuit unit 88 in the (n+1)th supply period. Therefore, the set value of the flow rate C1 of the carrier gas is increased by the amount of decrease in the vaporization amount A and, further, the flow rate C1 is increased.

Due to the increase in the flow rate C1 of the carrier gas, the total flow rate of the flow rate C1, the vaporization amount A of the raw material and the flow rate C2 of the dilution gas becomes greater than the total flow rate measured when the vaporization amount A is the set value. Therefore, the set value of the flow rate C2 of the dilution gas is decreased by the amount of the correction value. Accordingly, the flow rate C2 of the dilution gas is decreased by the amount of increase in the flow rate C1 of the carrier gas. As a result, the total flow rate of the flow rate C1 of the carrier gas, the vaporization amount A of the raw material and the flow rate C2 of the dilution gas is hardly changed. Such a state is shown at the right side of FIG. 8A.

Figure 8B:
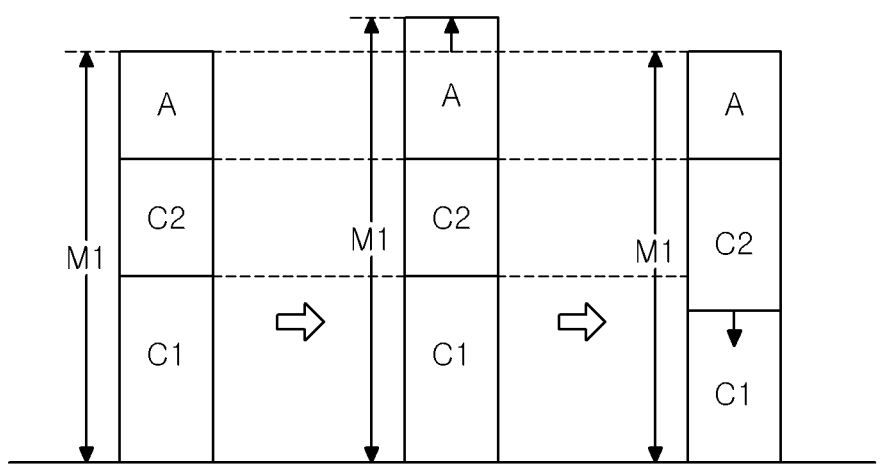

As illustrated at the center of FIG. 8B, if the vaporization amount A obtained in the n-th supply period, for example, is greater than the set value, the set value of the flow rate C1 of the carrier gas is decreased by the amount of increase in the vaporization amount A and, further, the flow rate C1 is decreased. Due to the decreased in the flow rate C1 of the carrier gas, the total flow rate of the flow rate C1, the vaporization amount A of the raw material, the flow rate C2 of the dilution gas becomes smaller than the total flow rate measured when the vaporization amount A is the set value. Therefore, the set value of the flow rate C2 of the dilution gas is increased by the amount of the correction value. Accordingly, the flow rate C2 of the dilution gas is increased by the amount of decrease in the flow rate C1 of the carrier gas. In that case as well, the total flow rate is hardly changed. In this manner, the vaporization amount of the raw material becomes stable and the variation in the total flow rate of the carrier gas and the dilution gas is suppressed. As a result, it is possible to control the vaporization amount of the raw material in the raw material gas with high precision.

The hold circuit unit 88 may hold the correction value in two consecutive supply periods. In other words, the same correction value may be used in two or three supply periods. Instead of providing the mass flow controller 61 for a carrier gas and the mass flow controller 62 for a dilution gas, it is also possible to combine a flow rate measurement unit (mass flow meter), a PID operation unit and a flow rate control valve which are separately provided.

In the above-described embodiments, the integration values of the flow rate M1 of the raw material gas and the flow rate C1 (or C1+C2) of the carrier gas in one of the raw material gas supply periods are obtained and the correction values of the flow rate C1 of the carrier gas and the flow rate C2 of the dilution gas are obtained based on the integration values. However, it is also possible to obtain the integration values of the flow rate M1 of the raw material gas and the flow rate C1 (or C1+C2) of the carrier gas in two or more consecutive supply periods and obtain the correction values by using two or more consecutive supply periods based on the integration values.

Further, it is possible to obtain the correction value of the flow rate C1 of the carrier gas which corresponds to the difference between the measured value and the set value of the vaporization amount A of the raw material and store the correction value in the memory of the control unit 8 or 80. Moreover, it is possible to read out the correction value (correction amount) corresponding to the difference between the set value and the measured value of the vaporization amount A of the raw material which is calculated by the PID operation unit 87, add the correction value to the flow rate of the carrier gas, and subtract the correction value (correction amount) added to the flow rate of the carrier gas from the flow rate of the dilution gas.

In the disclosure, as for the raw material, there is used one having a vapor pressure of about 66.5 Pa (0.5 Torr) at a vaporization temperature. Ni(II), N'-ditertiarybutylamidinate $(Ni(II)(tBu-AMD)_2$, (hereinafter, referred to as "Ni $(AMD)_2$") may be used instead of the aforementioned $WCl_6$. When $Ni(AMD)_2$ is used as the raw material, an Ni film is formed on a surface of the wafer W by an ALD method by alternately supplying a raw material gas and a reaction gas (reduction gas), e.g., an ammonia gas. When $Ni(AMD)_2$ is used as the raw material, it may be self-decomposed. Therefore, the vaporization temperature thereof is preferably set to 120° C. or less at the vapor pressure of 133 Pa (1 Torr).

The raw material accommodated in the raw material container 3 is not limited to a solid raw material. The raw material gas may be generated by vaporizing a liquid raw material. The configuration of the film forming unit 2 is not limited to a single-wafer processing type in which wafers W are mounted on a mounting table and subjected to film formation one at a time. The disclosure may be applied to the case of supplying a raw material gas to a batch type film forming unit in which a plurality of wafers W is held on a wafer boat and subjected to film formation or a film forming unit in which a plurality of wafers W is mounted on a rotating mounting table and subjected to film formation.

The film forming unit of the disclosure does not necessarily perform an ALD method and may perform a CVD method as long as a carrier gas that is an inert gas is supplied to a raw material container accommodating a solid or liquid raw material through a carrier gas supply line and a raw material gas containing a vaporized raw material is intermittently supplied to the film forming unit while alternately repeating a supply period and a pause period. For example, a first CVD film is formed by supplying a first CVD raw material gas into a chamber and, then, a second CVD film is formed by using a second CVD raw material gas different from the first CVD raw material gas. At least one of the first CVD raw material gas and the second CVD raw material gas serves as a raw material gas, which includes a vaporized raw material and a carrier gas supplied to the raw material container accommodating a solid or liquid raw material. The disclosure may be applied to a method for forming a thin film by alternately supplying both of the raw material gases into the chamber multiple times and substituting an atmosphere in the chamber by using a substitute gas between the supplies of the raw material gases.

The raw material gas that can be supplied in the disclosure is not limited to $WCl_6$. It may be a raw material gas containing a period 3 element in the periodic table, e.g., Al, Si or the like, a period 4 element in the periodic table, e.g., Ti, Cr, Mn, Fe, Co, Cu, Zn, Ge and the like, a period 5 element in the periodic table, e.g., Zr, Mo, Ru, Rh, Pd, Ag and the like, and a period 6 element in the periodic table, e.g., Ba, Hf, Ta, W, Re, Ir, Pt or the like. These raw material gases may be used in the case of forming an organic metal compound, an inorganic metal compound or the like. The reaction gas that reacts with the raw material gas may be an oxidizing gas using $O_2$, $O_3$, $H_2O$ or the like, a reduction gas using $NH_3$, $H_2$, HCOOH, $CH_3COOH$, $CH_3OH$, $C_2H_5OH$ or the like, a carbonization reaction gas using $CH_4$, $C_2H_6$, $C_2H_4$, $C_2H_2$ or the like, a nitriding reaction gas using $NH_3$, $NH_2NH_2$, $N_2$ or the like. The disclosure may also be applied to the case of providing a plurality of raw material gas supply units and forming an alloy, a complex metal oxide or the like by intermittently supplying two or more raw material gases to the film forming unit.

While the disclosure has been shown and described with respect to the embodiments, it will be understood by those skilled in the art that various changes and modifications may be made without departing from the scope of the disclosure as defined in the following claims.

What is claimed is:

1. A raw material gas supply apparatus for supplying a carrier gas that is an inert gas to a raw material container accommodating a solid or liquid raw material through a carrier gas supply line and intermittently supplying a raw material gas containing a vaporized raw material to a film forming unit while alternately repeating a supply period and a pause period, the apparatus comprising:
    a mass flow controller for the carrier gas, disposed in the carrier gas supply line and configured to control a flow rate of the carrier gas based on a set value of the flow rate of the carrier gas;
    a flow rate measurement unit, disposed in a raw material gas supply line that is disposed at an outlet side of the raw material container and configured to measure a flow rate of the raw material gas;
    a dilution gas supply line coupled to the raw material gas supply line and configured to allow a dilution gas that is the inert gas to be mixed with the raw material gas;
    a mass flow controller for the dilution gas, disposed in the dilution gas supply line and configured to control a flow rate of the dilution gas based on a set value of the flow rate of the dilution gas; and
    an operation processing unit configured to obtain a difference between a set value and a measured value of an amount of the vaporized raw material and a correction value based on the difference, add the correction value to the set value of the flow rate of the carrier gas to maintain the measured value of the amount of the vaporized raw material at the set value thereof, and subtract the correction value from the set value of the flow rate of the dilution gas to maintain a total flow rate of the carrier gas and the dilution gas at a constant level, wherein the amount of the vaporized raw material is calculated by subtracting an integration value of a measured value of a flow rate of the inert gas flowing through the flow rate measurement unit in the supply period from an integration value of the flow rate of the raw material gas which is measured by the flow rate measurement unit in the supply period.

2. The raw material gas supply apparatus of claim 1, wherein the dilution gas supply line is connected to a downstream side of the flow rate measurement unit in the raw material gas supply line, and
    wherein the integration value of the measured value of the flow rate of the inert gas flowing through the flow rate measurement unit in the supply period of the raw material gas is an integration value of a measured value of the flow rate of the carrier gas flowing through the carrier gas supply line.

3. The raw material gas supply apparatus of claim 2, wherein the integration value of the flow rate of the raw material gas which is measured by the flow rate measurement unit and the integration value of the measured flow rate of the inert gas flowing through the flow rate measurement unit are obtained by an integration circuit for the raw material gas and an integration circuit for the inert gas, respectively, and
    wherein in the integration circuits, the integration values obtained in the supply period of the raw material gas are reset before a next supply period of the raw material gas is started.

4. The raw material gas supply apparatus of claim 3, further comprising a hold circuit configured to hold the difference between the set value and the measured value of the amount of the vaporized raw material until a subsequent supply period of the supply period of the raw material gas is started.

5. The raw material gas supply apparatus of claim 2, further comprising a hold circuit configured to hold the difference between the set value and the measured value of the amount of the vaporized raw material until a subsequent supply period of the supply period of the raw material gas is started.

6. The raw material gas supply apparatus of claim 1, wherein the dilution gas supply line is connected to an upstream side of the flow rate measurement unit in the raw material gas supply line, and
    wherein the integration value of the measured value of the flow rate of the inert gas flowing through the flow rate measurement unit in the supply period of the raw material gas is an integration value of a sum of a measured value of the flow rate of the carrier gas flowing through the carrier gas supply line and a measured value of the flow rate of the dilution gas flowing through the dilution gas supply line.

7. The raw material gas supply apparatus of claim 6, wherein the integration value of the flow rate of the raw material gas which is measured by the flow rate measurement unit and the integration value of the measured flow rate of the inert gas flowing through the flow rate measurement unit are obtained by an integration circuit for the raw material gas and an integration circuit for the inert gas, respectively, and
    wherein in the integration circuits, the integration values obtained in the supply period of the raw material gas are reset before a next supply period of the raw material gas is started.

8. The raw material gas supply apparatus of claim 7, further comprising a hold circuit configured to hold the difference between the set value and the measured value of the amount of the vaporized raw material until a subsequent supply period of the supply period of the raw material gas is started.

9. The raw material gas supply apparatus of claim 6, further comprising a hold circuit configured to hold the difference between the set value and the measured value of the amount of the vaporized raw material until a subsequent supply period of the supply period of the raw material gas is started.

10. The raw material gas supply apparatus of claim 1, wherein the integration value of the flow rate of the raw material gas which is measured by the flow rate measurement unit and the integration value of the measured flow rate of the inert gas flowing through the flow rate measurement unit are obtained by an integration circuit for the raw material gas and an integration circuit for the inert gas, respectively, and wherein in the integration circuits, the integration values obtained in the supply period of the raw material gas are reset before a next supply period of the raw material gas is started.

11. The raw material gas supply apparatus of claim 10, further comprising a hold circuit configured to hold the difference between the set value and the measured value of the amount of the vaporized raw material until a subsequent supply period of the supply period of the raw material gas is started.

12. The raw material gas supply apparatus of claim 1, further comprising a hold circuit configured to hold the difference between the set value and the measured value of the amount of the vaporized raw material until a subsequent supply period of the supply period of the raw material gas is started.

* * * * *